United States Patent [19]
Sauer

[11] Patent Number: 5,646,575
[45] Date of Patent: Jul. 8, 1997

[54] COMPOSITE PRECISION, HIGH-FREQUENCY RAIL-TO-RAIL AMPLIFIER

[75] Inventor: Don Roy Sauer, San Jose, Calif.

[73] Assignee: National Semiconductor Corporation, Santa Clara, Calif.

[21] Appl. No.: 528,636

[22] Filed: Sep. 14, 1995

[51] Int. Cl.$^6$ .............................. H03F 3/45; H03F 3/68
[52] U.S. Cl. .......................................... 330/261; 126/295
[58] Field of Search ................................. 330/9, 84, 85, 330/126, 261, 295

[56] References Cited

U.S. PATENT DOCUMENTS

| | | | |
|---|---|---|---|
| 3,573,644 | 4/1971 | Evel | 330/9 |
| 3,757,241 | 9/1973 | Kime et al. | 330/261 |
| 4,532,479 | 7/1985 | Blauschild | 330/261 |
| 5,045,805 | 9/1991 | Schanen | 330/107 |
| 5,345,191 | 9/1994 | Tanaka | 330/85 X |
| 5,414,388 | 5/1995 | Sauer | 330/252 |

OTHER PUBLICATIONS

"IC Preamplifier Challenges Choppers on Drift", National Semiconductor, Application Note 79, Feb. 1993.

*Primary Examiner*—James B. Mullins
*Attorney, Agent, or Firm*—Skjerven, Morrill, MacPherson, Franklin & Friel; David E. Steuber

[57] ABSTRACT

A composite amplifier is constructed by connecting the respective input terminals of a high-frequency amplifier and a precision amplifier together and by connecting the output of the precision amplifier to the offset trim port of the high-frequency amplifier. The amplifiers are structured such than a pole in the frequency response curve of the high-frequency amplifier cancels a zero in the frequency response curve of the precision amplifier, thereby producing a single pole roll off response curve for the composite amplifier. In the preferred embodiment the high-frequency and precision amplifiers are formed on a single chip and the pole-zero match is therefore maintained at all conditions of temperature and other variables.

12 Claims, 4 Drawing Sheets

$$f_{pole} = \frac{1}{2\pi R_C} = \frac{gm2 \cdot R2}{2\pi C1(R2+R3)}$$

COMPOSITE PRECISION, HIGH-FREQUENCY RAIL-TO-RAIL AMPLIFIER

FIELD OF THE INVENTION

This invention relates to operational amplifiers and in particular to an operational amplifier which combines good precision and high-frequency characteristics with a rail-to-rail output.

BACKGROUND OF THE INVENTION

Amplifiers generally fall into different categories, depending on their performance characteristics. One such category includes high-frequency amplifiers, which are characterized by a wide bandwidth and a low open-loop gain. Another such category includes precision amplifiers, which are characterized by a narrower bandwidth but a higher open-loop gain, the latter feature making them more precise, i.e., the voltage drop across the inputs is very small when the amplifier is connected in a closed-loop configuration.

It is difficult to achieve the dual objectives of high-frequency and precise operation in a single amplifier because the very features which broaden the bandwidth of the amplifier also tend to reduce its open-loop gain. Similarly, the design criteria which increase open-loop gain tend to reduce the high-frequency response of the amplifier.

As shown in U.S. Pat. No. 5,045,805, it is known to increase open-loop gain by connecting a pair of high-frequency amplifiers in a cascade arrangement. Since the total gain is then the product of the individual gains, the precision of the amplifier pair is improved. However, such arrangements require a compensation network to maintain stability and adjustable circuitry for proper operation.

SUMMARY OF THE INVENTION

In a composite amplifier according to this invention, a high-frequency amplifier and a precision amplifier are interconnected. The inputs of the precision amplifier are connected across the inputs of the high-frequency amplifier. The output of the precision amplifier is connected to an offset trim port of the high-frequency amplifier. At high frequencies, the precision amplifier has relatively little effect, and the output of the composite amplifier is therefore dominated by the high-frequency amplifier. Conversely, at low frequencies, the precision amplifier contributes gain over and above the high-frequency amplifier, and the input offset is dominated by the offset of the precision amplifier.

The frequency response curve of the composite amplifier has a single pole and no zeros. This desirable curve is achieved by fabricating the high-frequency and precision amplifiers on a single chip and by arranging the parameters of the circuitry such that the pole of the high-frequency amplifier matches (i.e., cancels) the zero of the precision amplifier under all conditions of time, temperature, process, etc. Thus the pole of the composite amplifier is determined by the pole of the precision amplifier.

BRIEF DESCRIPTION OF THE DRAWING

The principles of this invention will be best understood by reference to the following figures of the drawing, in which like elements are identified by similar reference numerals.

DETAILED DESCRIPTION OF THE INVENTION

Figure 1:
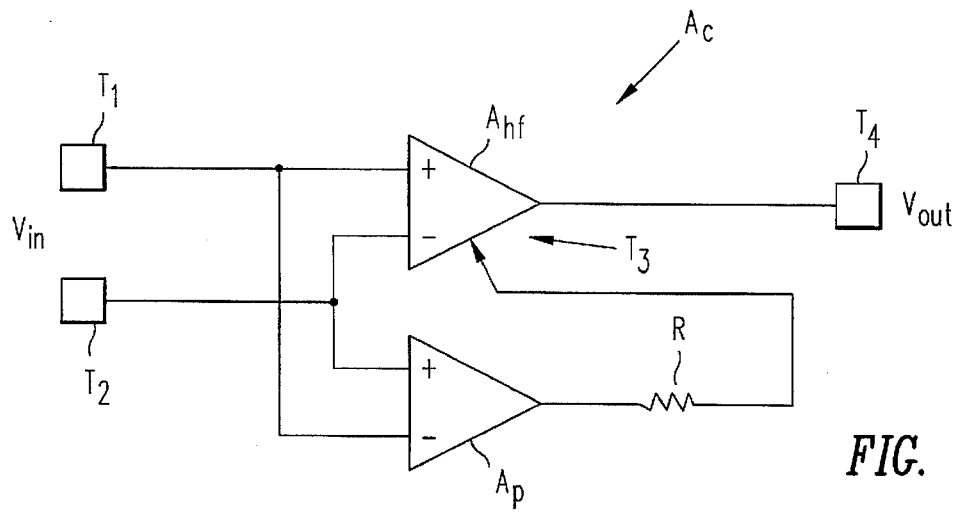
FIG. 1 illustrates a schematic block diagram of a composite amplifier in accordance with this invention.

FIG. 1 illustrates a composite amplifier $A_c$ in accordance with the invention which includes a precision amplifier $A_p$ and a high-frequency amplifier $A_{hf}$. The inputs of amplifiers $A_p$ and $A_{hf}$ are connected in the manner shown to input terminals $T_1$ and $T_2$, which receive a differential input signal $V_{in}$. The output of precision amplifier $A_p$ is connected through a resistor R to an offset trim port $T_3$ of high-frequency amplifier $A_{hf}$. A single-ended output signal $V_{out}$ is generated at a terminal $T_4$.

Figure 2:
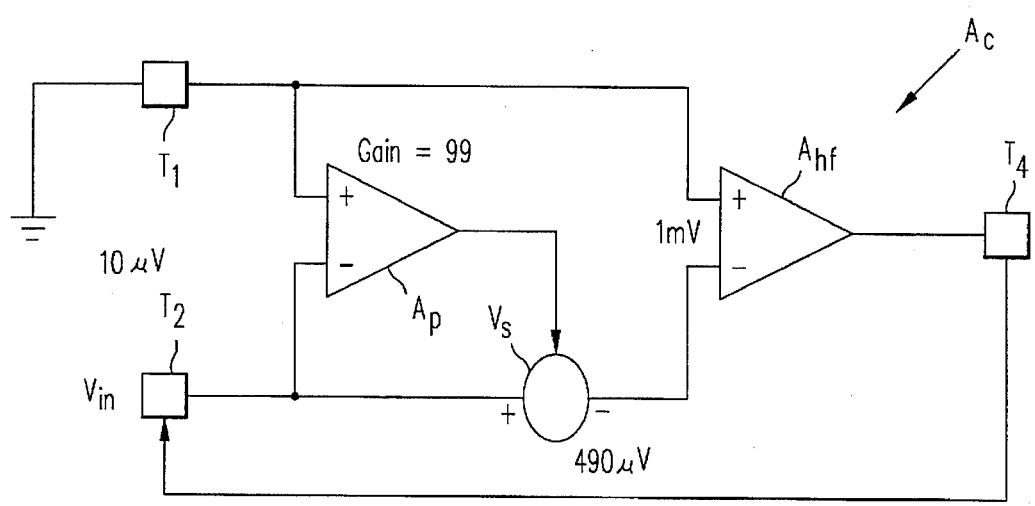
FIG. 2 illustrates an equivalent circuit for the composite amplifier.

FIG. 2 illustrates an equivalent circuit which helps to show the operation of composite amplifier $A_c$. Feeding the output of amplifier $A_p$ to the offset trim port $T_3$ is equivalent to inserting a voltage source $V_s$ in series with the input of the high-frequency amplifier $A_{hf}$. At high frequencies, amplifier $A_p$ has very little effect, and the high-frequency amplifier $A_{hf}$ dominates. At low frequencies, amplifier $A_p$ contributes gain over and above the gain provided by amplifier $A_{hf}$. Note that the voltage source $V_s$ is connected in the series path between terminals $T_1$ and $T_2$. Thus, for example, if the offset of amplifier $A_{hf}$ is 1 mV and amplifier $A_p$ contributes a gain of 99, then the offset at the input terminals of composite amplifier $A_c$ will be only 10 µV.

Figure 3:
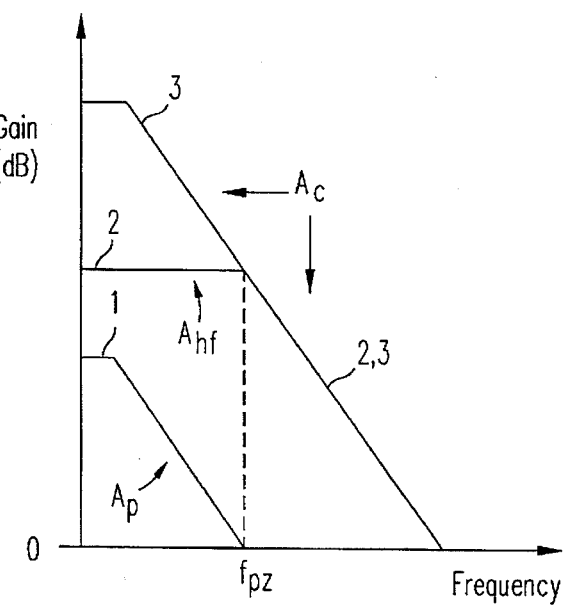
FIG. 3 illustrates a graph showing the frequency response curves of the precision amplifier, the high-frequency amplifier and the composite amplifier, respectively.

Illustrative frequency response curves for amplifiers $A_p$, $A_{hf}$ and $A_c$ are shown in FIG. 3. As indicated, the frequency response of precision amplifier $A_p$, represented by curve 1, has a pole at a low frequency and a zero at a frequency $f_{pz}$ which coincides with unity gain of amplifier $A_p$ into the voltage source $V_s$. The frequency response of high-frequency amplifier $A_{hf}$, represented by curve 2, has a single pole which also occurs at frequency $f_{pz}$. The frequency response of the composite amplifier $A_c$ is represented by curve 3, which is the product of curves 1 and 2. Curve 3 has a single pole which coincides with the pole of amplifier $A_p$. Because the zero of curve 1 matches the pole of curve 2, cancellation occurs in the corresponding region of curve 3. The frequency response of the composite amplifier (curve 3) therefore exhibits a high gain at low frequencies and, after its single pole is passed, a smooth decrease in gain until unity gain is reached at a frequency substantially higher than $f_{pz}$.

Obtaining this smooth decrease depends upon insuring that the pole of curve 2 matches the zero of curve 1 under all conditions of temperature, time, etc. How this is accomplished will now be described.

Figure 4:
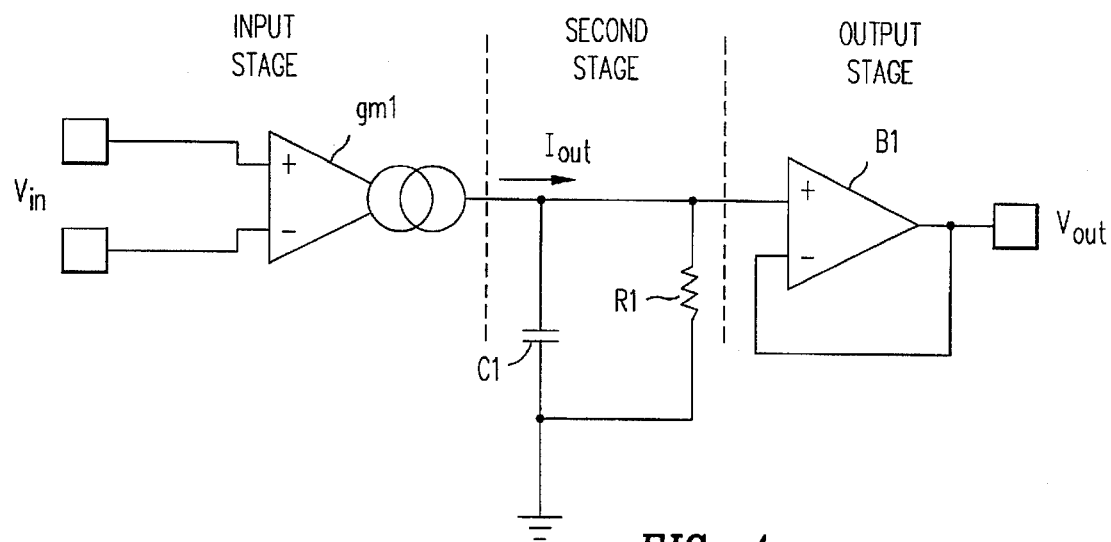
FIG. 4 illustrates a block diagram of a conventional operational amplifier.

FIG. 4 illustrates a more detailed block diagram of a conventional operational amplifier. This represents the structure of precision amplifier $A_p$ and high-frequency amplifier $A_{hf}$ (less the offset trim port). The amplifier shown in FIG. 4 includes an input stage, a second stage and an output stage. This structure is described in greater detail in numerous sources, including, for example, Thomas M. Frederiksen, "Intuitive IC OP Amps", 1984, pages 12–16, which is incorporated herein by reference. The input stage includes a differential amplifier and a current mirror, which together operate to transform the differential input voltage $V_{in}$ into a single-ended current $I_{out}$. The combination of the differential amplifier and current mirror are sometimes referred to as a "transconductance amplifier" which has a transfer function $I_{out}/V_{in}$ and which is designated by the reference gm1 in FIG. 4.

The second stage includes a compensation capacitor C1. The bandwidth of the amplifier depends on where the current $I_{out}$ has a unity gain into capacitor C1 referenced to $V_{in}$. The low-frequency pole is normally set by a parasitic resistance, shown as R1, that can be viewed as connected in parallel with capacitor C1. Since the input stage is CMOS, the output of the transconductance amplifier gm1 will be somewhat dependent on process and temperature.

The output stage includes a buffer B1 which has a high input impedance and is connected in a unity gain configuration.

A more detailed description of an input stage, a second stage and an output stage is found in application Ser. No. 08/205,530, filed Mar. 3, 1994 (now U.S. Pat. No. 5,414,388), application Ser. No. 08/205,573, filed Mar. 3, 1994, and application Ser. No. 08/148,121, filed Nov. 5, 1993, respectively, each of which is commonly owned by the assignee hereof and is incorporated herein by reference in its entirety.

Figure 5:
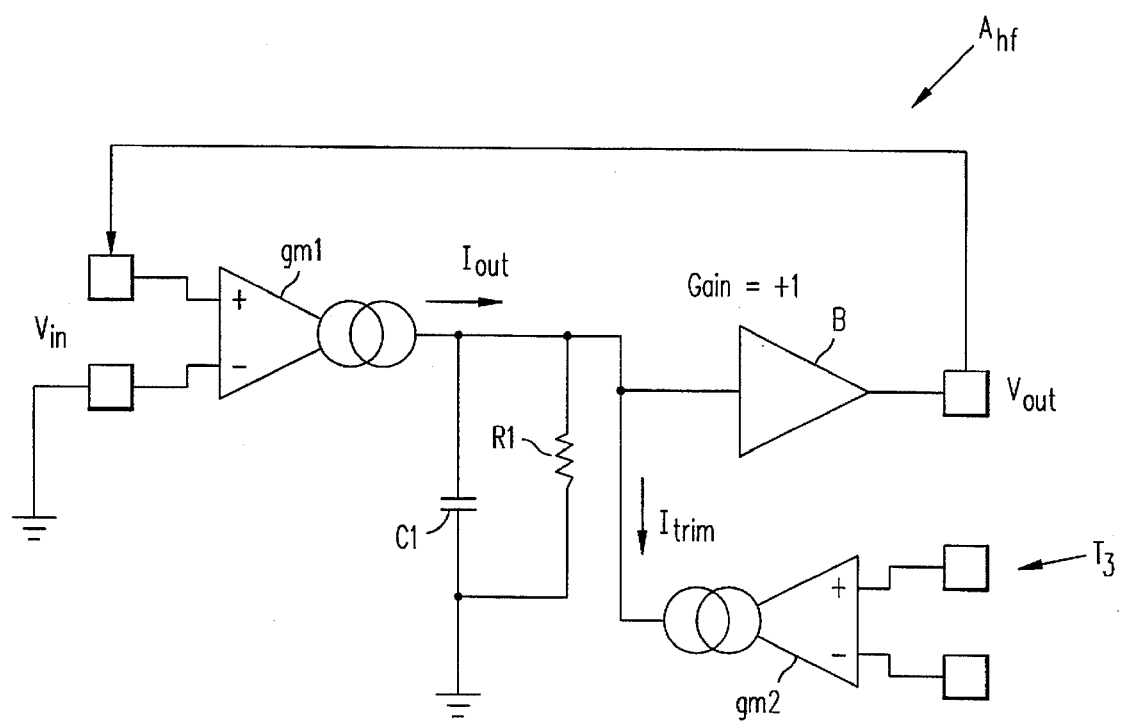
FIG. 5 illustrates a block diagram of a conventional operational amplifier having an offset trim port.

FIG. 5 illustrates a block diagram of the amplifier $A_{hf}$ including the offset trim port $T_3$. A second transconductance amplifier gm2 introduces a current $I_{trim}$ into capacitor C1 (actually, as shown by the arrow, $I_{trim}$ flows out of capacitor C1). The voltage at the trim port $T_3$ is adjusted such that in the presence of negative feedback, the voltage $V_{in}$ is equal to zero.

Figure 6:
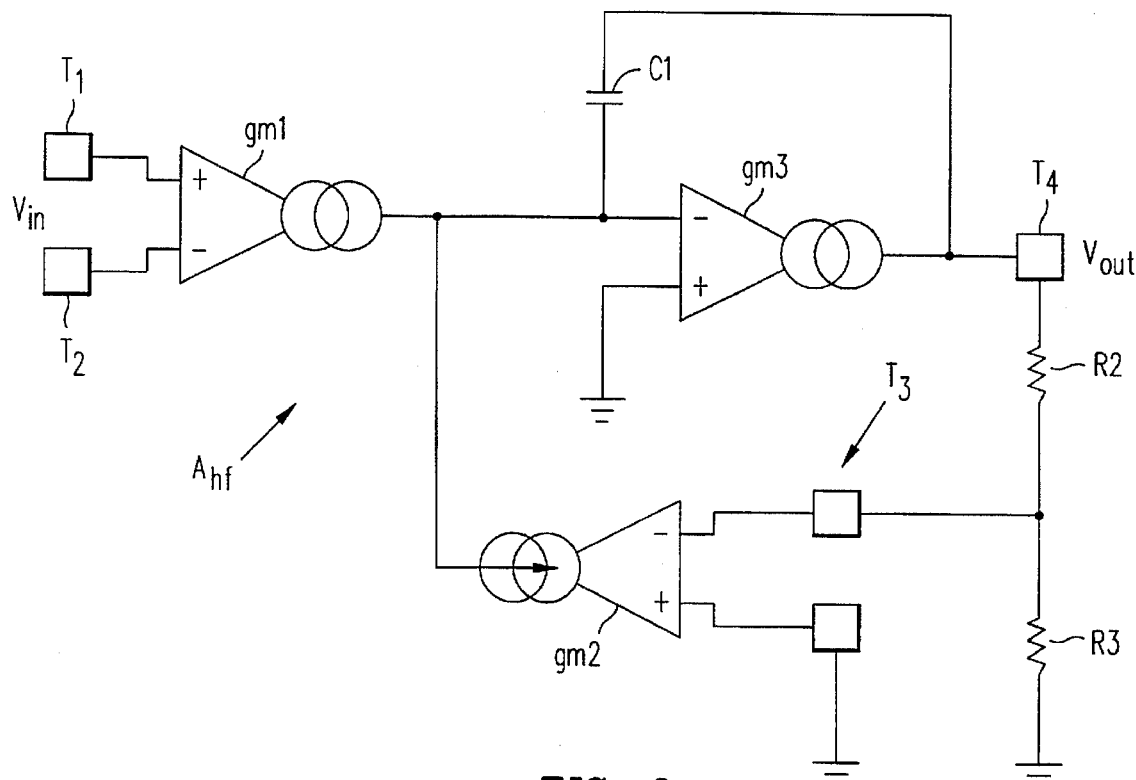
FIG. 6 illustrates a more detailed block diagram of the high-frequency amplifier which forms a part of the composite amplifier of this invention.

FIG. 6 illustrates the high-frequency amplifier $A_{hf}$ configured in accordance with the invention. In amplifier $A_{hf}$, the capacitor/buffer configuration of FIG. 5 is replaced with a transconductance (gm3)/virtual ground configuration in order to provide a rail-to-rail output stage. The output of transconductance amplifier gm1 now goes to a virtual ground, which means that the output of gm1 effectively sees a short to ground. Transconductance stage gm3 is also a CMOS input stage. This removes any bias current loading at the output of transconductance amplifier gm1. Thus, with this architecture, the open-loop gain of the amplifier is very high even when the output is heavily loaded. The compensation capacitor C1 is shown in parallel with transconductance amplifier gm3.

With the arrangement shown in FIG. 6 the resistor R1 in FIGS. 4 and 5 has effectively been replaced by the combination of a network of resistors R2 and R3 and transconductance amplifier gm2. Since the transfer function of a transconductance amplifier is in the form I/V, a transconductance amplifier can be viewed as the equivalent of a resistor have a value equal to the inverse of the transfer function. Therefore, the total resistance in parallel with capacitor C1 is equal to $(1/gm2)*(R2+R3)/R2$.

Figure 7:
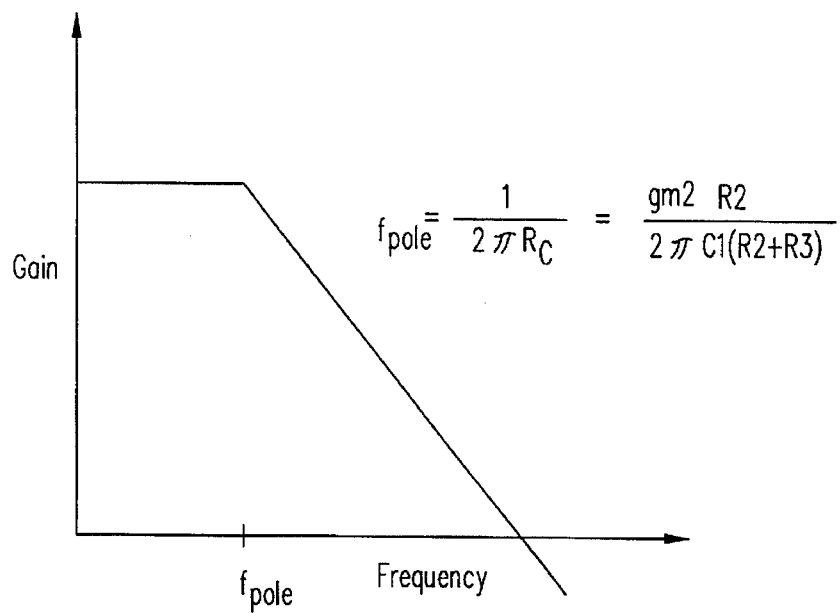
FIG. 7 illustrates a frequency response curve of the high-frequency amplifier shown in FIG. 6.

The transfer function of amplifier $A_{hf}$ is shown in FIG. 7. As is well known, the pole occurs at a frequency equal to $1/2\pi RC$. Substituting the value C1 for the compensation capacitor C1 and the value $(1/gm2)*(R2+R3)/R2$ for R yields the following expression of the pole frequency $f_{pole}$ in terms of C1, gm2, R2 and R3:

$$F_{pole}=gm2*R2/((R2+R3)*2*\pi*C1)$$

Amplifier $A_{hf}$ reaches unity gain at a frequency equal to $gm1/2\pi C1$.

Figure 8:
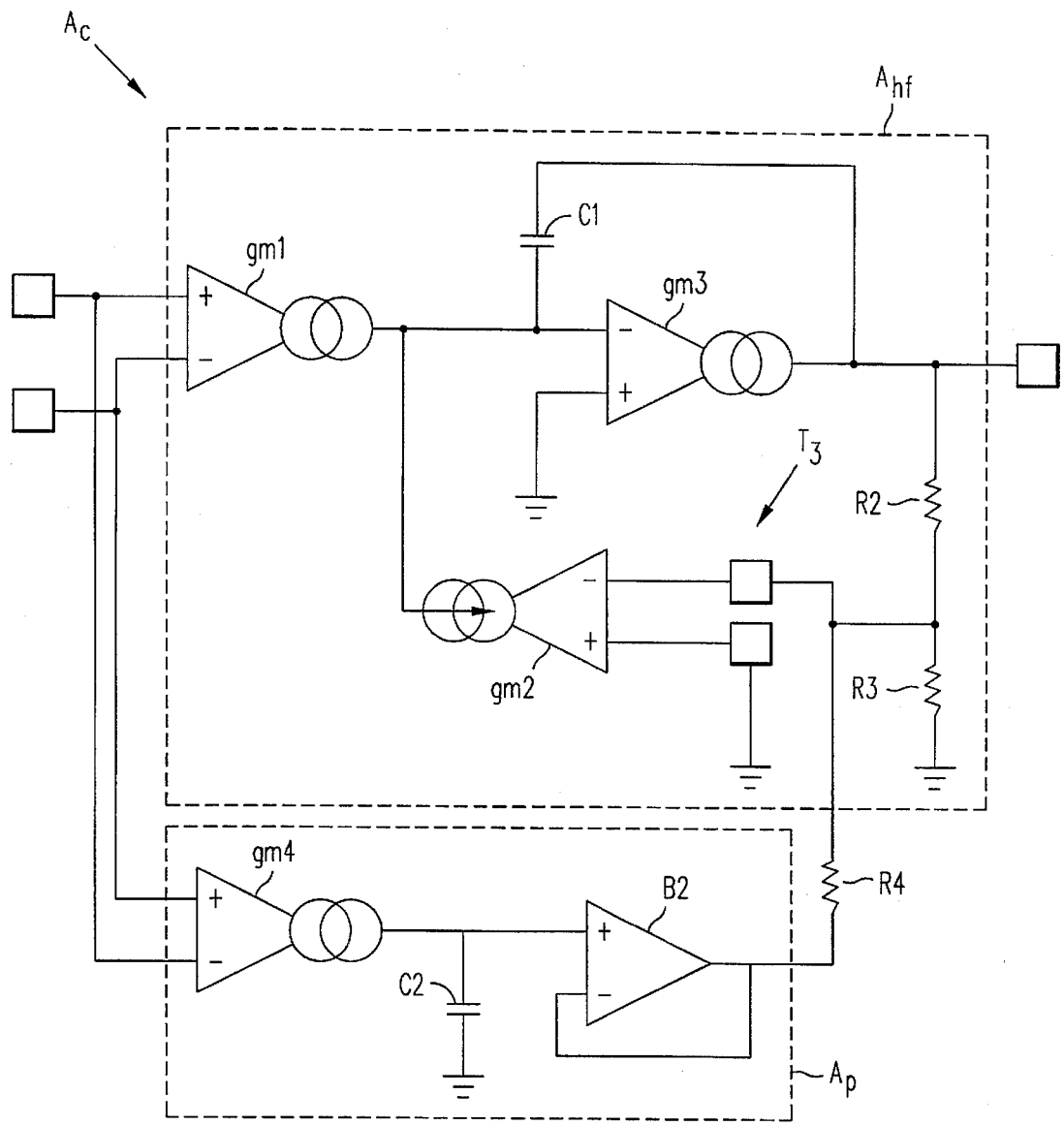
FIG. 8 illustrates a more detailed block diagram of the composite amplifier, showing both the high-frequency amplifier and the precision amplifier.

FIG. 8 shows amplifiers $A_{hf}$ and $A_p$ connected together so as to form a composite amplifier in accordance with the invention. Precision amplifier $A_p$ includes a transconductance amplifier gm4 and a compensation capacitor C2. Transconductance amplifier gm4 should be formed in CMOS, and transconductance amplifiers gm1 and gm4 should be formed on the same chip and fabricated such that they essentially track each other regardless of process, temperature, output load, etc.

Figure 9:
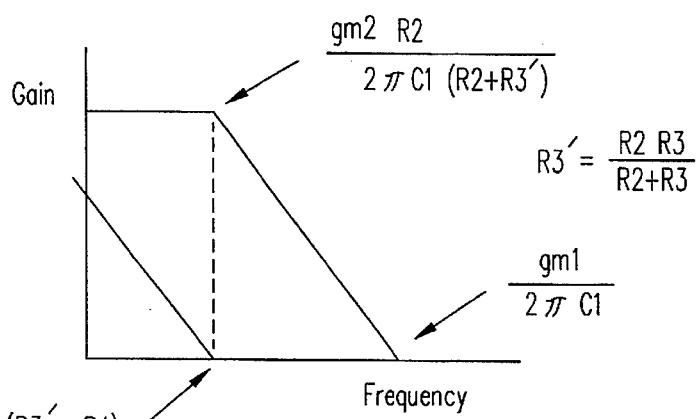
FIG. 9 illustrates curves showing the frequency response of the high-frequency and precision amplifiers, respectively.

Referring now to FIG. 9, the zero in the transfer function for amplifier $A_p$ occurs where the gain of gm4 through gm2 equals the gain of gm1. At the zero frequency $f_{zero}$, the following relationship holds:

$$gm1=(gm4/(2*\pi*f_{zero}*C2))*(R3'/(R4+R3'))*gm2$$

where $R3'=R2*R3/(R2+R3)$

Solving for $f_{zero}$ yields the following:

$$f_{zero}=(gm4/gm1)*(1/2*\pi*C2)*(R3'/(R4+R3'))*gm2$$

As noted above, it is desired to have the pole amplifier $A_{hf}$ cancel the zero of amplifier $A_p$. In this situation $f_{pole}=f_{zero}=f_{pz}$ (see FIG. 3).

Equating the above expressions for $f_{pole}$ and $f_{zero}$ yields:

$$((R2+R3')/R2)*(R4/(R4+R3'))=(gm4/gm1)*(C2/C1)$$

Thus gm2 drops out of the equation, and the pole and zero are found to track each other if the required ratios of resistors (R2, R3, R4), capacitors (C1, C2) and gains (gm1, gm4) are maintained. In particular, the transconductance amplifiers gm2 and gm3 need not track each other or gm1 or gm4.

The composite amplifier disclosed herein has extremely high open loop gain, extremely high bandwidth and extremely low offset. Because the CMOS transconductance amplifier gm3 is used in place of a conventional buffer in the output stage of the high-frequency amplifier $A_{hf}$, the composite amplifier operates rail-to-rail.

While a particular embodiment of this invention has been described, numerous alternative embodiments within the spirit of this invention are possible and will be apparent to person skilled in the art.

I claim:

1. A composite amplifier comprising a first amplifier and a second amplifier, said second amplifier having an offset trim port, respective inputs of said first and second amplifiers being connected together and an output of said first amplifier being connected to said offset trim port.

2. The composite amplifier of claim 1 wherein a voltage applied to said offset trim port controls a current which is summed with a current supplied by an input stage of said second amplifier.

3. The composite amplifier of claim 1 wherein a pole in a frequency response curve of said second amplifier occurs at substantially the same frequency as a zero in a frequency response curve of said first amplifier.

4. The composite amplifier of claim 1 wherein said second amplifier comprises a first transconductance amplifier having inputs connected to inputs of said second amplifier and a second transconductance amplifier having inputs connected to said offset trim port.

5. The composite amplifier of claim 4 wherein outputs of said first and second transconductance amplifiers are connected together.

6. The composite amplifier of claim 5 wherein said second amplifier further comprises a third transconductance amplifier having an input connected to the outputs of said first and second transconductance amplifiers.

7. The composite amplifier of claim 6 wherein said second amplifier further comprises a capacitor, said capacitor being connected in parallel with said third transconductance amplifier.

8. The composite amplifier of claim 7 wherein said first amplifier comprises a fourth transconductance amplifier.

9. The composite amplifier of claim 8 wherein a gain of said first transconductance amplifier is substantially equal to the product of the respective gains of said second and fourth transconductance amplifiers.

10. The composite amplifier of claim 1 wherein said first amplifier comprises a precision amplifier and said second amplifier comprises a high-frequency amplifier.

11. The composite amplifier of claim 1 wherein an inverting input of said first amplifier is connected to a non-inverting input of said second amplifier.

12. The composite amplifier of claim 1 wherein a non-inverting input of said first amplifier is connected to an inverting input of said second amplifier.

\* \* \* \* \*